TUNNEL DIODE GATE CIRCUIT

Filed Dec. 6, 1962 2 Sheets-Sheet 1

INVENTOR.
BADEN L. COSBY
BY Arthur H. Swanson
ATTORNEY.

Jan. 4, 1966 B. L. COSBY 3,227,894

TUNNEL DIODE GATE CIRCUIT

Filed Dec. 6, 1962 2 Sheets-Sheet 2

INVENTOR.
BADEN L. COSBY
BY Arthur H. Swanson
ATTORNEY.

United States Patent Office 3,227,894

Patented Jan. 4, 1966

3,227,894
TUNNEL DIODE GATE CIRCUIT

Baden L. Cosby, Norristown, Pa., assignor to Honeywell Inc., a corporation of Delaware Filed Dec. 6, 1962, Ser. No. 242,729
6 Claims. (Cl. 307—88.5)

A divisional application by Baden L. Cosby, Serial No. 343,436 has been filed on January 17, 1964 and subject matter disclosed but not claimed in this application is shown and claimed in the aforesaid divisional application.

This invention relates to data handling apparatus. More specifically, the present invention relates to analog to digital converters.

An object of the present invention is to provide an improved analog to digital converter.

Another object of the present invention is to provide an improved analog to digital converter having a transistorized logic circuit for governing a conversion operation.

A further object of the present invention is to provide an improved self-governing logic circuit for controlling an analog to digital conversion operation.

A still further object of the present invention is to provide an improved analog to digital converter, as set forth herein, having a simplified operation and construction.

In accomplishing these and other objects there has been provided, in accordance with the present invention, an analog to digital converter having a selectively operated reference signal source which is operated by a logic circuit to produce a reference signal substantially equal in amplitude to an unknown signal to be converted. The logic circuit is responsive to a decision amplifier intermittently comparing the unknown signal with the reference signal. The logic circuit is self-governing to increase the reference signal in discrete digital steps by a plurality of tunnel diode gating circuits and to provide a read-out of the amplitude of the reference signal. The logic circuit incorporates means for resetting the reference signal to an initial level in preparation for a new conversion operation.

A better understanding of the present invention may be had by reading the following description in connection with the attached drawings, in which.

Figure 1:
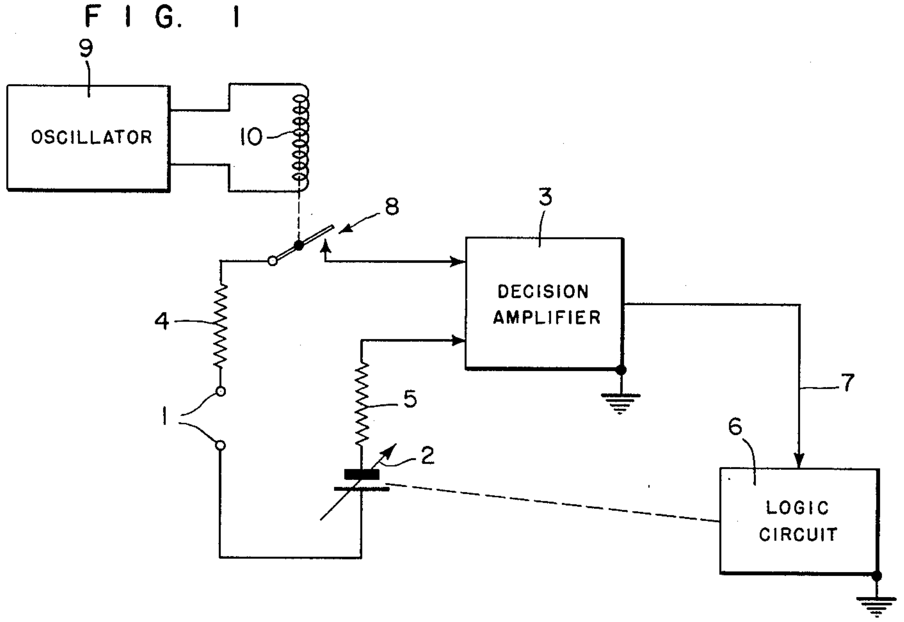
FIG. 1 is a schematic illustration of an analog to digital converter embodying the present invention.

Referring to FIG. 1, there is shown an analog to digital converter embodying the present invention. An unknown potential to be converted is applied to a pair of input terminals 1. The unknown potential is compared with a variable reference potential source 2 by a decision amplifier 3. The amplifier 3 may be any suitable device, such as a differential amplifier, for comparing two input signals to produce an output signal having a polarity representative of the difference of the input signals; i.e., a positive polarity output signal represents a reference signal which is smaller than the unknown signal and vice versa. The unknown potential and the reference potential are isolated from the decision amplifier 3 by respective resistors 4 and 5.

The output signal from the decision amplifier 3 is applied to a logic circuit 6 along a line 7 to control the operation of the reference source 2. The logic circuit 6 is effective to respond to both polarities of the output signal from the amplifier 3 to produce a reference signal having a substantial equality with the unknown signal whereby an indication of the amplitude of the reference signal may be used as the amplitude indication of the unknown potential. A pair of relay contacts 8 are used to periodically interrupt the application of the unknown potential to the amplifier 3 whereby the output signal from the amplifier 3 is periodically interrupted to produce signal pulses of either positive or negative polarity on the line 7. An oscillator 9 is used to energize a relay coil 10 to operate the contacts 8.

Figure 2:
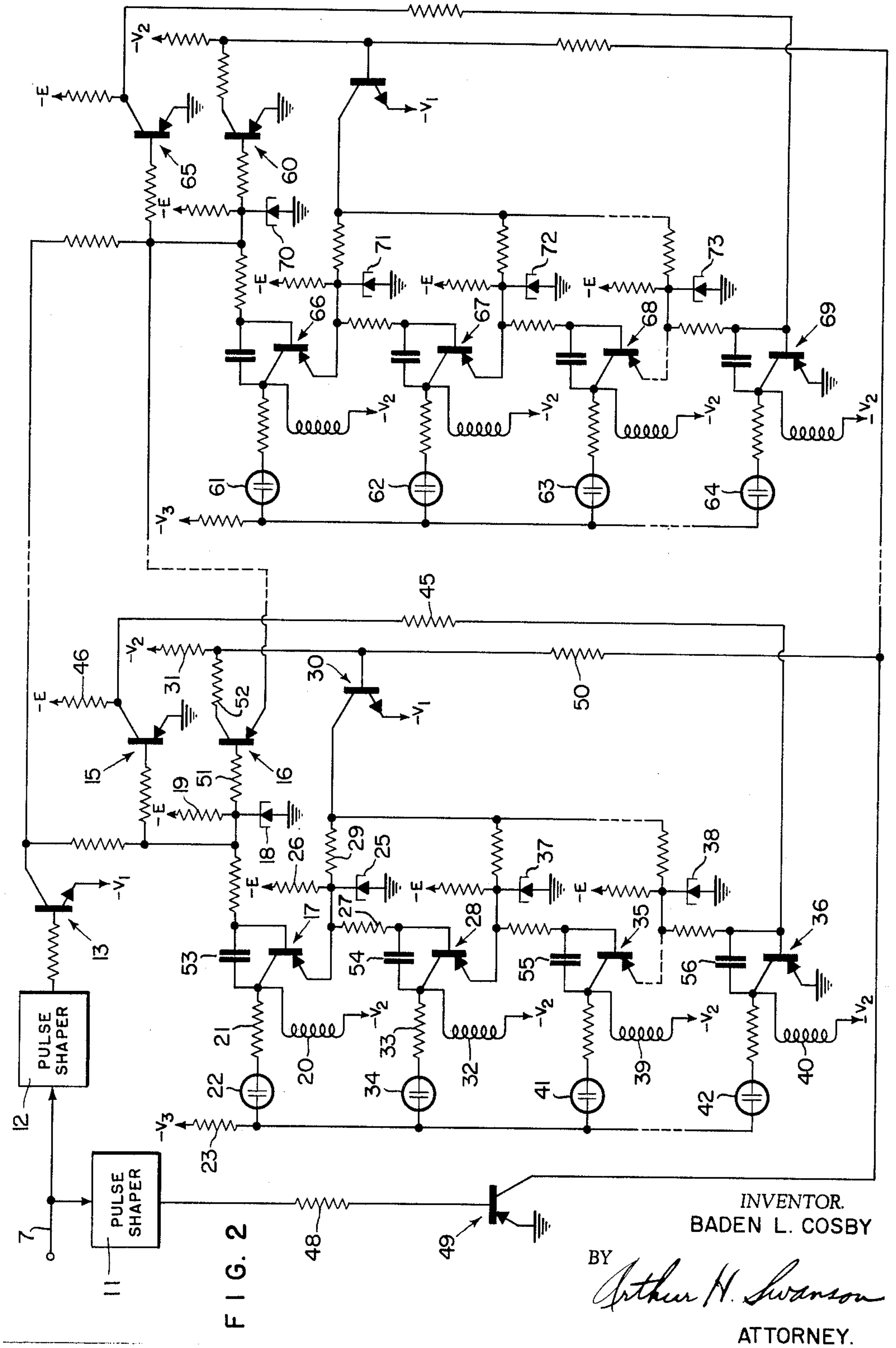
FIG. 2 is a schematic illustration of the logic circuit shown in FIG. 1.

Referring to FIG. 2, there is shown a logic circuit suitable for use in the apparatus of FIG. 1 as logic circuit 6. The input line 7 is connected to a pair of pulse shaper circuits 11 and 12 for shaping positive and negative input pulses, respectively. The positive signal output of the negative pulse shaper 12 is applied to the base electrode of an NPN transistor 13 to bias transistor 13 into a conducting state. The output current signal from the conductive state of the transistor 13 is applied to the base electrodes of control transistors in similar subsections of the circuit 6. These sub-sections, or decades, are each used to control a corresponding order of magnitude of the reference signal. Thus, the first decade may be used to vary the reference signal in steps of ten volts each; e.g., 0 to 90. The succeeding decades would be used to vary the reference signals in decreasing orders of magnitude; e.g., units, tenths, etc. For purposes of this discussion, the schematic of the circuit 6 shown in FIG. 2 is limited to two decades; however, it may be appreciated that the number of decades may be increased without affecting the basic form of the illustrated circuit by simply duplicating the decades shown in FIG. 2.

In the first decade, the output of transistor 13 is connected to the base circuits of three PNP transistors 15, 16 and 17. A tunnel diode 18 having one end grounded is also connected to the collector circuit of transistor 13 and is biased from a source —E through a resistor 19. The collector circuit of transistor 17 is connected to source $-V_2$ through a relay coil 20. The collector end of the relay coil 20 is also connected through a resistor 21 to one side of a neon indicator light 22. The other side of the light 22 is connected through a common resistor 23 to a source $-V_3$.

The emitter of transistor 17 is connected to a tunnel diode 25 which is biased from source —E through a resistor 26 and, through a resistor 27, to the base of a transistor 28. The tunnel diode 25 is also connected through a resistor 29 to the collector of a stepping transistor 30. The emitter of transistor 30 is connected to a source $-V_1$ while the base is connected through a resistor 31 to source $-V_2$.

The collector of transistor 28 is connected through a relay coil 32 to source $-V_2$ and through a resistor 33 to one side of a neon indicator 34. The other side of the indicator 34 is connected through the resistor 23 to the source $-V_3$. The rest of the first decade is a repetition of the relay coil, tunnel diode, neon indicator, and transistor circuitry described above using additional transistors 35, 36, tunnel diodes 37, 38, relay coils 39, 40 and neon indicators 41, 42. The emitter of the last decade transistor 36 is connected to ground. The base of transistor 36 is connected through resistor 45 to the collector of transistor 15 and to source —E through a resistor 46.

The negative signal output from the positive pulse shaper 11 is applied through a resistor 48 to the base of a PNP transistor 49 to bias transistor 49 into a conductive state. The emitter of transistor 49 is connected to ground while the collector is connected through a resistor 50 to the base of transistor 30. Tunnel diode 18 is also connected through a resistor 51 to the base of transistor 16. The collector of transistor 16 is connected by a resistor 52 and the resistor 31 to the source $-V_2$. Capacitors 53, 54, 55, and 56 may be connected between the base and collector electrodes of transistors 17, 28, 35 and 36, respectively, to condition the response of these transistors in the operation of the logic circuit.

The succeeding decades of the logic circuit are substantially repetitions of the above described decade circuit and are connected thereto at three points. These are the collectors of transistors 13 and 49 and the emitter of transistor 16. The decade shown in FIG. 2 is the last decade of a plurality of decades and differs from the succeeding decades by a ground connection for the emitter of transistor 60 which is the functional equivalent of transistor 16 shown in the first decade. Neon lights 61, 62, 63 and 64 are used as indicators for the last decade. Transistor 65 in the last decade is the functional equivalent of transistor 15 in the first decade. Transistors 66, 67, 68 and 69, used in the last decade to energize the associated relay coils, are controlled by tunnel diodes 70, 71, 72 and 73, respectively.

In operation, the logic circuit 6 of the present invention is arranged to adjust the reference source 2 to provide an initial reference signal which has a maximum amplitude. Thus, all the decades would be set to the last, or nine, position. In this condition, the last transistors in the decades, e.g., transistors 36 and 69, would be in a conducting condition to energize their respective relays. These relays are effective to operate the reference source 2 to produce the largest reference signal available. This reference signal is compared with the unknown signal applied to terminals 1. Since the converter of the present invention is to be used with signals having an amplitude smaller than its largest reference signal amplitude, this initial comparison is effective to produce a negative signal on the amplifier output line 7. The relay contacts 8 are effective to periodically interrupt the input to the amplifier 3 to convert the aforesaid negative signal to a negative pulse having a predetermined duration. This negative pulse, after polarity inversion by application to pulse shaper 12, is used to supply a current from transistor 13 to tunnel diode 18.

The tunnel diode 18 is continually biased by a current through resistor 19. However, this current is insufficient to switch the diode 18 from a low voltage state to a high voltage state. The additional current supplied by the inverted negative pulse will trigger the tunnel diode along its characteristic curve to its high voltage stable point. This high voltage point is sufficient to turn on transistors 15, 16 and 17. Turning on transistor 15 is effective to turn off transistor 36 to terminate the energization of relay coil 40. The deenergization of coil 40 is effective to remove the nine position of the first decade. For the purpose of this example, assume there are only two decades, e.g., 1 and 10 unit decades. Initially, the reference signal would be 99 units. Removing the 9 unit of the ten decade reduces the reference signal to 9 units. Also, the zero unit of the 10 unit decade is turned on by transistor 17 through the relay coil 20. The neon light 22 is on turned to indicate the energization of the zero unit relay coil of the 10 unit decade. Capacitor 53 is connected across the transistor 17 to slow down the current rise of the transistor whereby the next tunnel diode 25 is not affected by the setting of the zero level circuit.

Assume the unknown signal level is 75 units. The above described action will occur on the first comparison by the decision amplifier since the initial 99 unit reference signal is greater than the unknown. By reducing the tens decade to zero, the reference signal is left at a 9 unit level. This level is below the unknown level and is effected to produce a positive signal from the amplifier 3. This positive signal is applied to the pulse shaper 11 and is effective to turn on transistor 49. The current signal from transistor 49 is applied to transistor 30. As previously mentioned, the initial negative pulse had turned on transistor 16. The output signal from transistor 16 in combination with the signal from transistor 49 is effective to turn on transistor 30. The output signal from transistor 30 is applied to all the tunnel diodes in the first decade. However, only the second tunnel diode 25 is biased by the source −E and the signal from the preceding zero level transistor 17. The addition of the current from transistor 30 is effective to switch only tunnel diode 25 to a high voltage state and to turn on the second transistor 28. Additionally, the high voltage state of the tunnel diode 25 balances the high voltage state of tunnel diode 18 to remove the input signal from transistor 17. Accordingly, transistor 17 is turned off as transistor 28 is on, while tunnel diodes 18 and 25 are retained in a high voltage state. This action is effective to turn off the zero level relay coil 20 and to turn on the first level relay coil 32.

The relay coil 32 is arranged to increase the reference signal ten units for an overall reference signal of 19 units. Since this reference signal is still smaller than the unknown, the next pulse from amplifier 3 is still a positive pulse which is effective to switch on the next tunnel diode 37 which has been biased by the source −E and the conducting condition of transistor 28. The switching of tunnel diode 37 is effective to remove the input signal from transistor 28 as described above for transistor 17. The conducting condition of transistor 35 is effective to turn on relay coil 39 to increase the reference signal by twenty units to a level of 29. Thus, the positive stepping pulses from transistor 49 through transistor 30 continue to step the first decade by switching succeeding tunnel diodes into a high voltage state until a reference level of 79 units is reached upon the energization of the seventh level of the tens decade.

The 79 units reference signal level is sensed by the amplifier 3 as a larger signal than the unknown signal, and the next pulse from the amplifier 3 is a positive pulse. This positive pulse is applied as an output current from transistor 13 to tunnel diode 70 of the next decade. Tunnel diode 70 has previously been conditioned by bias current signals from the source −E and the transistor 16. With the addition of the current from the negative shift pulse, tunnel diode 70 is switched to a high voltage state. Since both tunnel diodes 70 and 18 are in a high voltage state no effective input signal exists at the base of transistor 16. As a result of this balanced condition, transistor 16 is turned off and the stepping gate transistor 30 is closed to further positive stepping signals. Additionally, the high voltage state of tunnel diode 70 is effective to turn on transistors 60, 65 and 66. Transistor 65, in turn, turns off transistor 69, which is the control transistor for the nine level of the units decade. Transistor 66 turns on the zero level of the units decade to provide a total reference signal of 70 units.

This new reference signal level is effective to produce a positive pulse signal from the amplifier 3. This positive signal is applied as a stepping signal to transistor 30 in the first decade where it has no effect since transistor 16 has been turned off. In the second decade, this stepping pulse, in combination with the on condition of transistor 60, is effective to step the second decade in a manner as described above until a reference signal level of 76 units is reached. At this level, the positive pulse train from amplifier 3 is discontinued and a negative shift pulse is applied from the amplifier 3. This negative shift pulse may be used to energize further decades to increase the accuracy of the analog to digital converter. Since in the example, there are only two decades, this shift pulse has no effect and the neon lights for the 76 unit reference level may be read as an approximate digital representation of the unknown signal.

At the end of the conversion operation, the analog to digital converter may be returned to the previously mentioned initial condition of a nine level for all decades by momentarily removing the −E source from all the tunnel diodes and transistors 15 and 65. The removal of the current bias for the tunnel diodes supplied by the source −E is effective to return all the tunnel diodes to a low voltage state. The low voltage state of the tunnel diodes is effective to turn off transistors 15 and 65 and the relay control transistors in the decades whereby the reference signal is removed from the amplifier 3. When the —E source is restored, the tunnel diodes remain in a low voltage state. However, the —E source is now applied to the bases of the nine level transistors 36 and 69 to turn on the nine level relays for each of the decades. The further operation of the present invention is a repetition of the above described operation.

Thus, it may be seen that there has been provided, in accordance with the present invention, an analog to digital converter having a self-governing logic-circuit for controlling the analog to digital conversion operation.

What is claimed is:

1. A gate circuit comprising a transistor having an input circuit, a load circuit and a return circuit, a first biased tunnel diode means connected to said input circuit and arranged to supply a signal to said input circuit, a first input terminal connected to said tunnel diode for connecting said diode to a current signal source suitable to selectively switch said tunnel diode from a low voltage state to a high voltage state, a second biased tunnel diode connected in said return circuit to supply a return current path for said transistor, and a second input terminal connected to said second tunnel diode for connecting said second diode to said current signal source for selectively switching said second tunnel diode from a low voltage state to a high voltage in combination with a current in said return circuit from said transistor whereby said transistor is biased into a non-conducting state when said first and second diodes are in the same state.

2. A gate circuit comprising a current control means having an input circuit, an output circuit and a return circuit, a first tunnel diode means connected to said input circuit and arranged to supply a bias signal to said input circuit representative of a switching of the voltage states of said tunnel diode, and a second tunnel diode connected in said return circuit to supply a signal to said return circuit when said second diode is switched between its voltage states whereby said transistor is biased into a non-conducting state when said first and second diodes are in the same state.

3. A gate circuit comprising a current control means having an input signal circuit, an output current circuit and a return current circuit, a first tunnel diode means having a first electrode and a second electrode, circuit means connecting said first electrode to said input circuit of said current control means to apply a signal to said input circuit representative of the voltage state of said first diode, a first input means connected to said first diode to selectively switch said first diode from a low voltage state to a high voltage state, a second tunnel diode having a first electrode and a second electrode corresponding to said electrodes of said first diode, circuit means connecting said second diode in said return current circuit to apply a signal to said return circuit representative of the voltage states of said second diode whereby said current control means is biased into a non-conducting state when said first and second diodes are in the same state and a second input means connected to said second diode to selectively switch said second diode from a low voltage state to a high voltage state in combination with a current in said return circuit.

4. A gate circuit comprising a transistor having a collector electrode, a base electrode and an emitter electrode, a first tunnel diode having a first electrode and a second electrode, circuit means connecting said first electrode of said tunnel diode to said base to apply a signal thereto representative of the voltage state of said tunnel diode, first input means connected across said diode means and operative to connect said diode to a current source suitable for selectively switching said diode between its voltage states, a second tunnel diode having first electrode and a second electrode corresponding to said electrodes of said first diode, circuit means connecting said second diode in a current path to said emitter with said first electrode connected to said emitter, and second input means connected across said second diode and operative to connect said second diode to a current source to switch said second diode between its voltage states in combination with an emitter current from said transistor whereby said transistor is biased into a non-conducting state when said first and second diodes are in the same voltage state.

5. A gate circuit comprising a first transistor having a collector electrode, a base electrode and an emitter electrode, a first tunnel diode having a first electrode and a second electrode, circuit means connecting said first electrode of said tunnel diode to said base to apply a signal thereto representative of the voltage state of said tunnel diode, first input means connected across said diode means and operative to connect said diode to a current source suitable for selectively switching said diode between its voltage states, a second tunnel diode having first electrode and a second electrode corresponding to said electrodes of said first diode, circuit means connecting said second diode in a current path to said emitter with said first electrode connected to said emitter, and second input means connected across said second diode and operative to connect said second diode to said current source to switch said second diode between its voltage states in combination with an emitter current from said transistor, a second transistor having a collector electrode, a base electrode and an emitter electrode, circuit means connecting said base of said second transistor to said emitter of said first transistor whereby said first transistor is biased into a non-conducting state when said diodes are in the same voltage state and said second transistor is biased into a conducting state when said second diode is in a high voltage state.

6. A gate circuit as set forth in claim 5 including a third tunnel diode having a first electrode and a second electrode corresponding to said first and second diodes, circuit means connecting said third diode in a current path to said emitter of said second transistor with said first electrode of said third diode connected to said emitter of said second transistor and third input means connected across said third diode and operative to connect said third diode to said current source to switch the voltage state of said third diode in combination with an emitter current from said second transistor whereby said second transistor is biased into a non-conducting state when said second and third diodes are in the same voltage state.

References Cited by the Examiner

UNITED STATES PATENTS

| | | | |
|---|---|---|---|
| 2,839,744 | 6/1958 | Slocomb | 340—347 |
| 3,008,056 | 11/1961 | Wanlass | 307—88.5 |
| 3,021,517 | 2/1962 | Kaenel | 307—88.5 |
| 3,031,585 | 4/1962 | Frady | 307—88.5 |
| 3,064,191 | 11/1962 | Dever et al. | 340—347 |

OTHER REFERENCES

Exclusive-OR Logic Circuit Using a Tunnel Diode, Amodei et al., RCA Technical Notes No. 435 Jan. 1961.

Hemel: A Study of Tunnel Diodes For Digital Electronic Circuits, March 1962.

JOHN W. HUCKERT, *Primary Examiner.*

MALCOLM A. MORRISON, DAVID J. GALVIN, *Examiners.*